United States Patent [19]

Liu

[11] Patent Number: 6,008,990
[45] Date of Patent: Dec. 28, 1999

[54] CARTRIDGE TYPE CPU MODULE COOLING STRUCTURE

[76] Inventor: Yen-Wen Liu, 13F, No. 90 Chiu-Kang St., Wen-Shan Dist, Taipei, Taiwan

[21] Appl. No.: 09/197,517

[22] Filed: Nov. 23, 1998

[51] Int. Cl.⁶ .................................................. H05K 7/20
[52] U.S. Cl. ........................ 361/704; 165/80.3; 174/16.3; 361/710; 361/715; 257/719
[58] Field of Search ................................. 165/80.2, 80.3, 165/185; 174/16.3; 257/706–707, 712–713, 718–719, 726–727; 361/704, 707, 709–710, 717–718

[56] References Cited

U.S. PATENT DOCUMENTS

| | | | |
|---|---|---|---|
| 5,375,652 | 12/1994 | Matsunaga et al. | 165/80.3 |
| 5,422,790 | 6/1995 | Chen | 361/719 |
| 5,662,163 | 9/1997 | Mira | 165/80.3 |
| 5,883,782 | 3/1999 | Thurston et al. | 361/704 |
| 5,883,783 | 3/1999 | Turturro | 361/704 |
| 5,886,873 | 3/1999 | Ahn | 361/719 |

Primary Examiner—Gregory Thompson
Attorney, Agent, or Firm—Bacon & Thomas

[57] ABSTRACT

A cartridge type CPU module cooling structure includes a fixing plate fastened to upright mounting rods of a heat sink to hold down a CPU module on the heat sink, wherein the upright mounting rods of the heat sink each have a neck; the fixing plate has a plurality of projecting spring leaves respectively coupled to the upright mounting rods of the heat sink, and a plurality of mounting slots respectively extended to the spring leaves for permitting the spring leaves to be coupled to the upright mounting rods, the mounting slots each having an expanded insertion portion at one end through which one upright mounting rod of the heat sink is inserted to hold the fixing plate on the CPU module at a first position, and an elongated guide portion extended from the respective expanded insertion portion to a part of one spring leaf into which the neck of one upright mounting rod is engaged to hold the fixing plate on the CPU module at a second position, causing the respective spring leaf to deform and to impart a pressure to the CPU module against the heat sink.

11 Claims, 5 Drawing Sheets

CARTRIDGE TYPE CPU MODULE COOLING STRUCTURE

BACKGROUND OF THE INVENTION

The present invention relates to a cartridge type CPU module cooling structure, and more particularly to such a cartridge type CPU module cooling structure which can easily and detachably be installed to fix a heat sink to a cartridge type CPU module for quick dissipation of heat.

Following quick development of high technology, advanced CPUs (central processing units) have been continuously developed. From early 16-bit CPUs to modern 64-bit CPUs, the data processing speed of CPUs has been greatly improved. When a high-speed CPU is operating, it produce much heat, and heat must be quickly carried away in order to not affect the performance of the CPU. A variety of heat sinks have been disclosed for this purpose.

SUMMARY OF THE INVENTION

The present invention has been accomplished to provide a cartridge type CPU module cooling structure which enables a heat sink to be quickly and detachably fastened to a cartridge type CPU module for quick dissipation of heat. According to one aspect of the present invention, the cartridge type CPU module cooling structure comprises a fixing plate fastened to upright mounting rods of a heat sink to hold down a CPU module on the heat sink, wherein the upright mounting rods of the heat sink each have a neck; the fixing plate has a plurality of projecting spring leaves respectively coupled to the upright mounting rods of the heat sink, and a plurality of mounting slots respectively extended to the spring leaves for permitting the spring leaves to be coupled to the upright mounting rods, the mounting slots each having an expanded insertion portion at one end through which one upright mounting rod of the heat sink is inserted to hold the fixing plate on the CPU module at a first position, and an elongated guide portion extended from the respective expanded insertion portion to a part of one spring leaf into which the neck of one upright mounting rod is engaged to hold the fixing plate on the CPU module at a second position, causing the respective spring leaf to deform and to impart a pressure to the CPU module against the heat sink. According to another aspect of the present invention, a guide plate is mounted on the upright mounting rods of the heat sink and retained between the CPU module and the fixing plate to guide the fixing plate between the first position and the second position.

DETAILED DESCRIPTION OF THE PREFERRED EMBODIMENT

Figure 1:
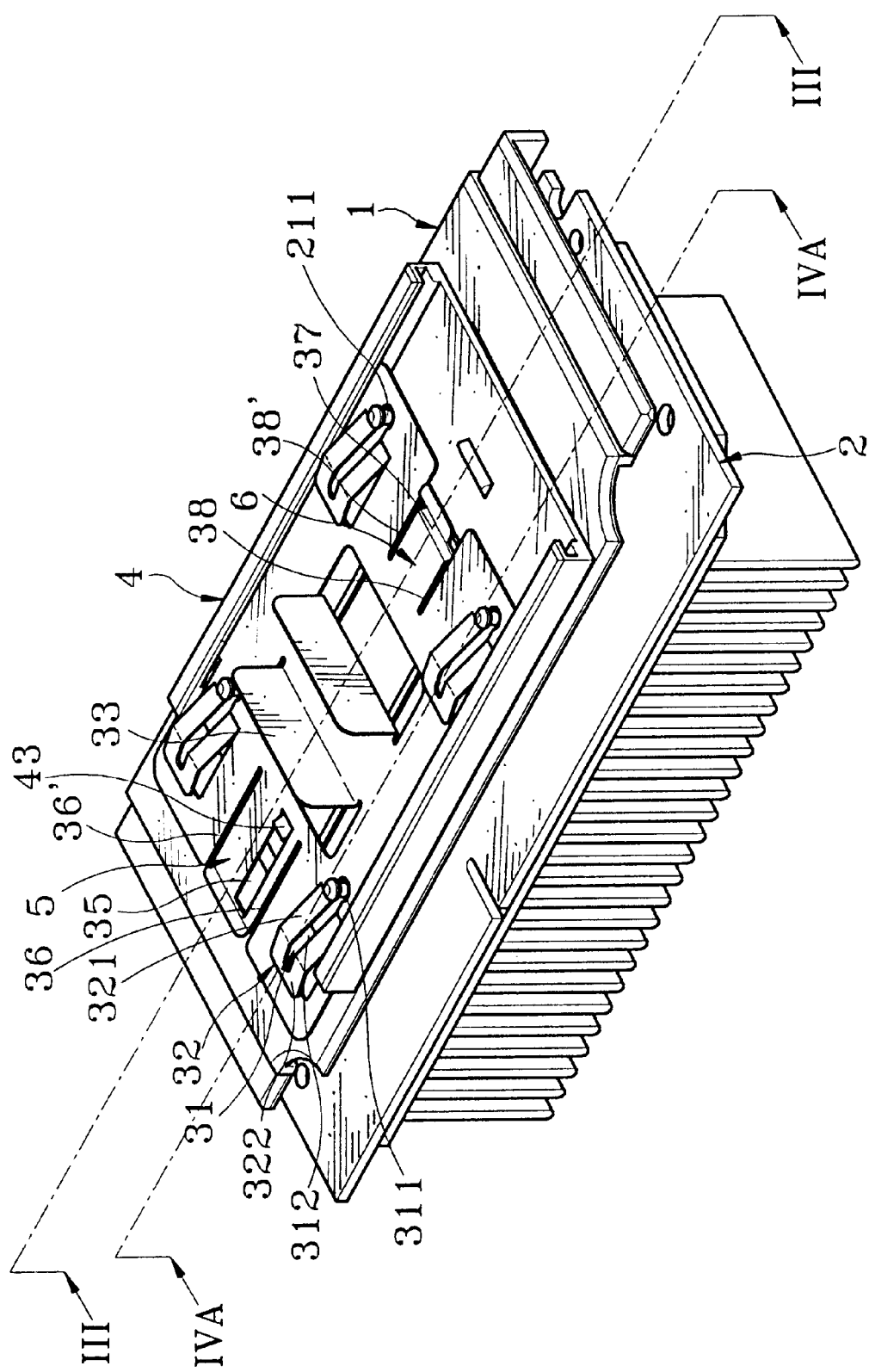
FIG. 1 is a perspective view of a cartridge type CPU module cooling structure according to the present invention.
Figure 2:
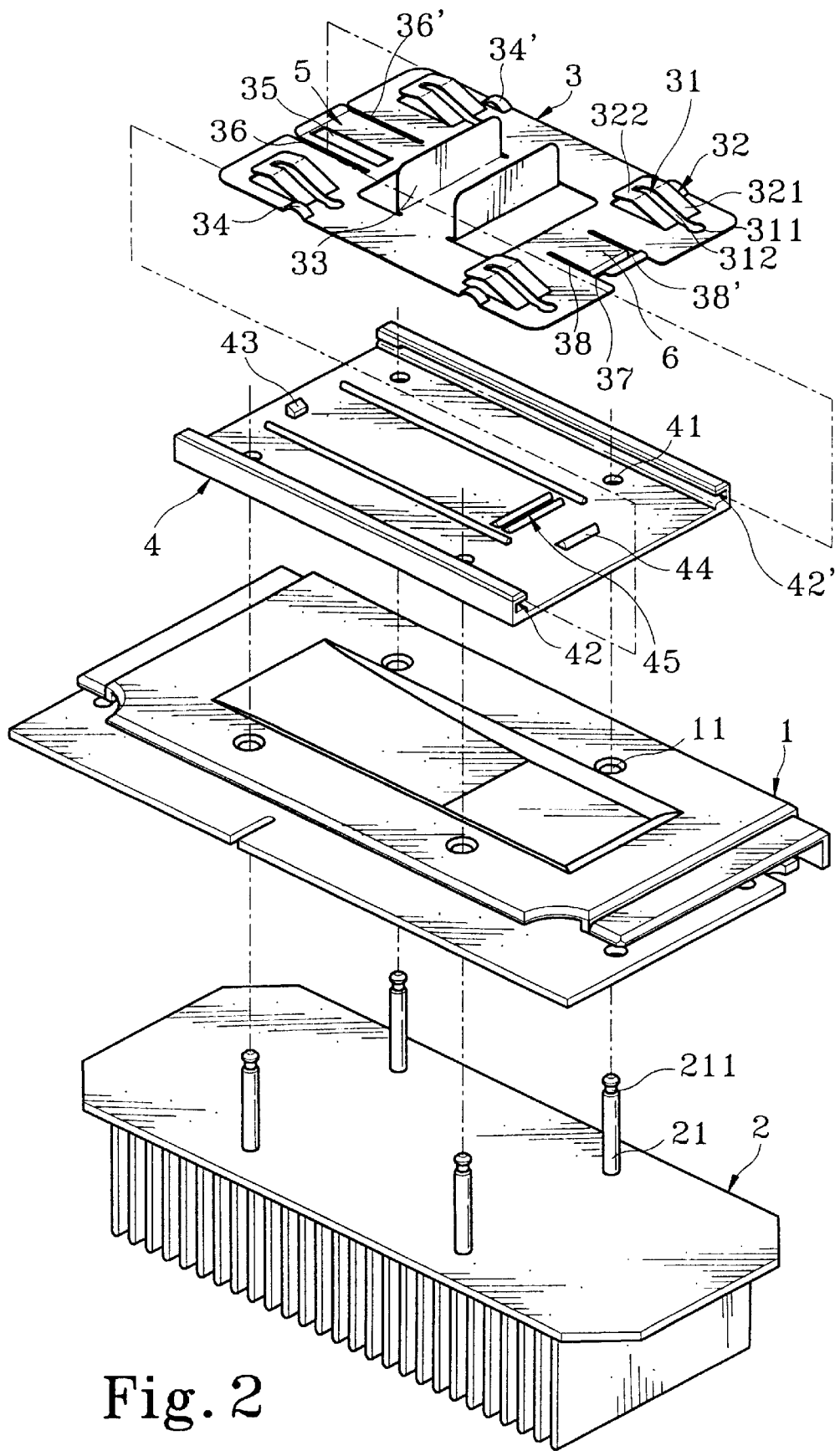
FIG. 2 is an exploded view of FIG. 1.
Figure 3:
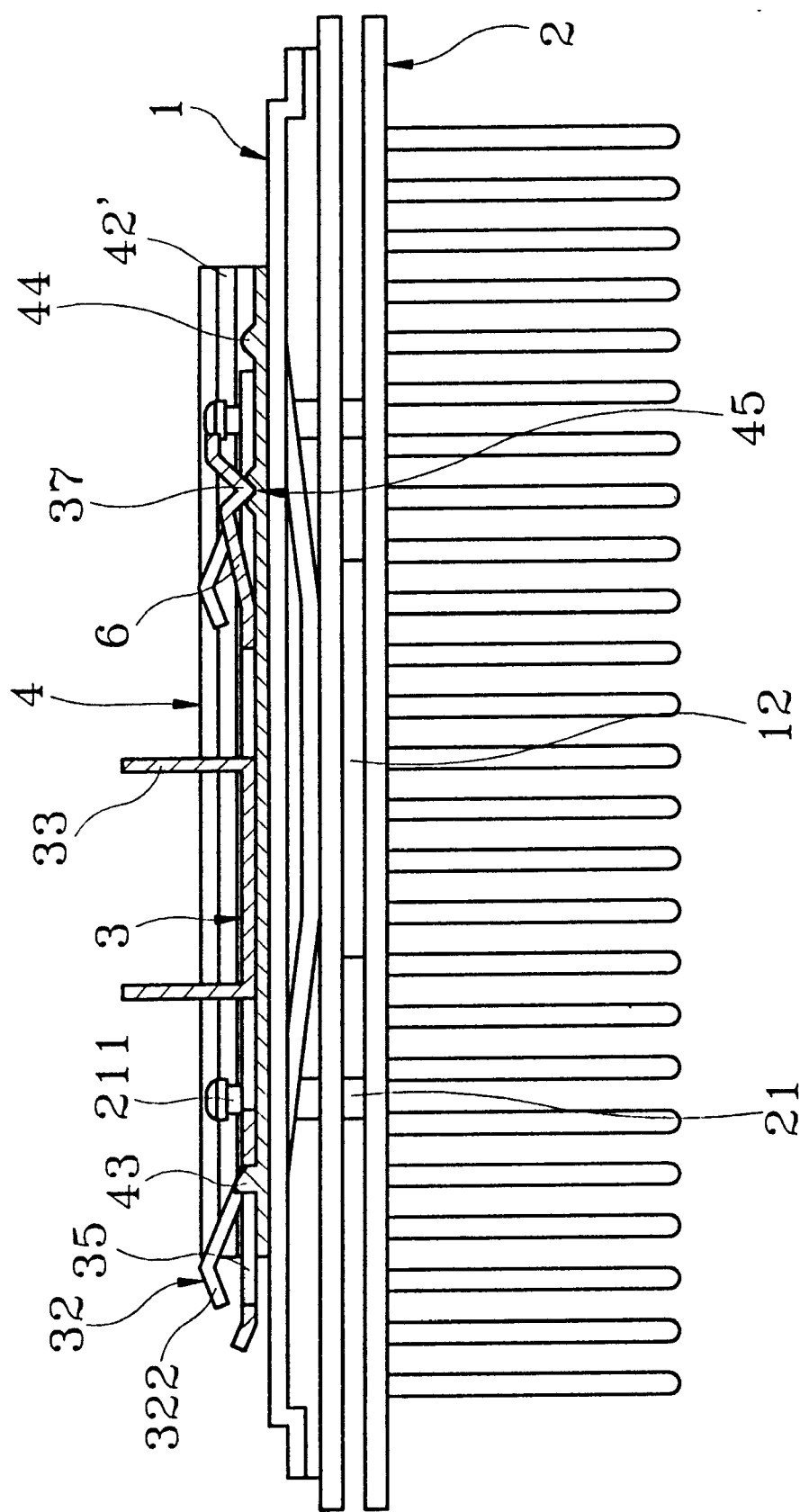
FIG. 3 is a sectional view taken along line III—III of FIG. 1.

Referring to FIGS. 1, 2 and 3, the present invention is generally comprised of a cartridge type CPU module 1, a heat sink 2, a fixing plate 3, and a guide plate 4.

The CPU module 1 is retained between the heat sink 2 and the guide plate 4, having a plurality of through holes 11. The heat sink 2 is closely attached to one side of the CPU module 1, having a plurality of upright mounting rods 21 respectively inserted through the through holes 11 at the CPU module 1. The upright mounting rods 21 each have a neck 211 near the end.

Figure 4A:
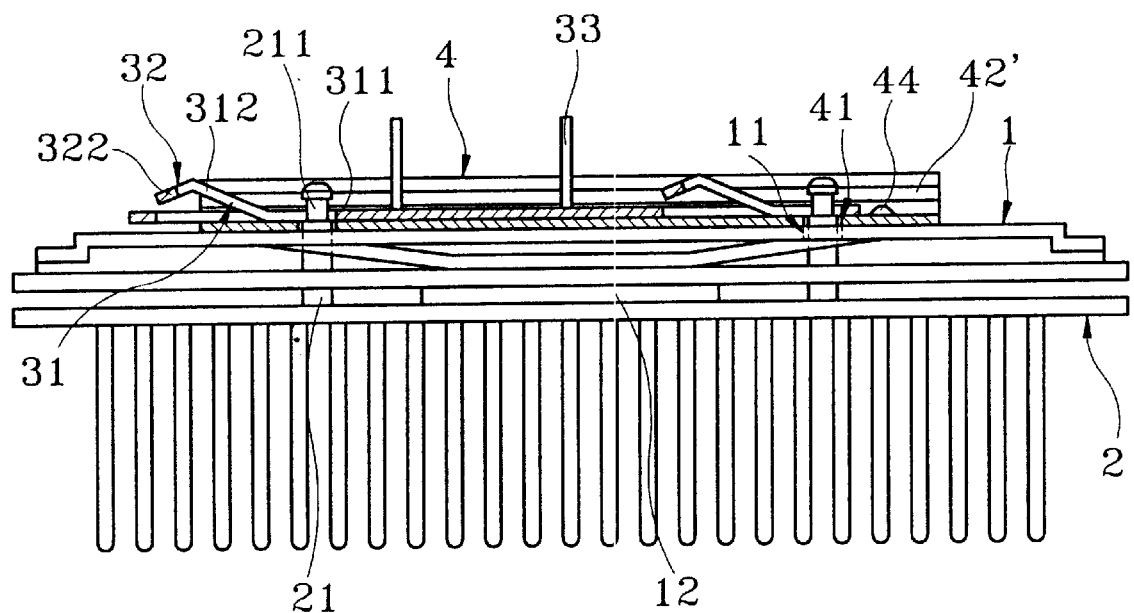
FIG. 4A is a sectional view taken along line IVA—IVA of FIG. 1.
Figure 4B:
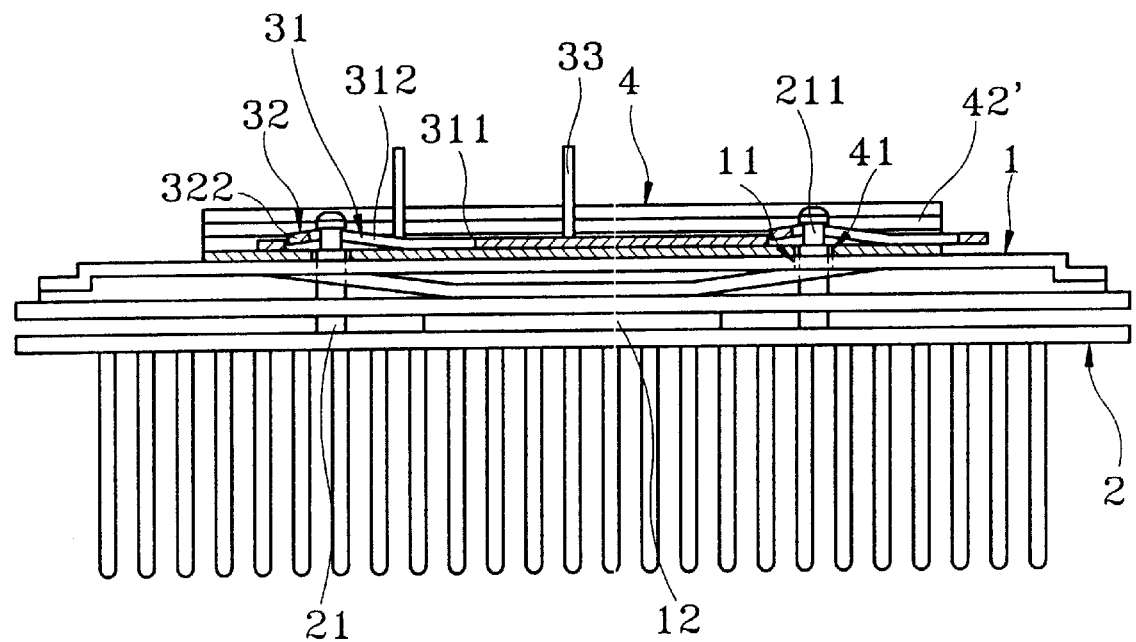
FIG. 4B is similar to FIG. 4A but showing the fixing plate moved to the second position.

Referring to FIGS. 4A and 4B and Figures from 1 through 3 again, the fixing plate 3 is fastened to the upright mounting rods 21 of the heat sink 2 to hold down the CPU module 1 on the heat sink 2, comprising a plurality of mounting slots 31 and spring leaves 32 corresponding to the upright mounting rods 21 of the heat sink 2. Each mounting slot 31 comprises an expanded insertion portion 311 at one end, and an elongated guide portion 312 extended from the expanded insertion portion 311 to a part of one spring leaf 32. Each spring leaf 32 comprises a sloping portion 321 at one end namely the fixed end, and a retaining portion 322 at an opposite end namely the free end. The width of the elongated guide portion 312 is smaller than the diameter of the upright mounting rods 21 but approximately equal to the diameter of the necks 211 of the upright mounting rods 21. When the upright mounting rods 21 of the heat sink 2 are respectively inserted through the expanded insertion portions 311 of the mounting slots 31, the fixing plate 3 is disposed at the first position (see FIG. 4A). When the fixing plate 3 is moved relative to the heat sink 2 from the first position shown in FIG. 4A to the second position shown in FIG. 4B, the necks 211 of the upright mounting rods 21 are forced into engagement with the elongated guide portions 312, and respectively moved with the respective upright mounting rods 21 from the sloping portions 321 of the spring leaves 32 to the retaining portions 322, causing the spring leaves 32 to deform and to impart a downward pressure to the CPU module 1 against the heat sink 2, and therefore the CPU module 1 and the heat sink 2 are firmly retained in close contact with each other for quick dissipation of heat. The guide plate 4 is retained between the CPU module 1 and the fixing plate 3, comprising a plurality of through holes 41 through which the upright mounting rods 21 of the heat sink 2 pass, two longitudinally extended parallel sliding rails 42 and 42' at two opposite lateral sides into which the fixing plate 3 is inserted and moved between the aforesaid first position (see FIG. 4A) and second position (see FIG. 4B). The guide plate 4 guides the movement of the fixing plate 3 between the first position and the second position, and prevents a damage to the CPU module 1 during movement of the fixing plate 3 between the first position and the second position.

Referring to Figures from 1 through 3 again, the fixing plate 3 further comprises a handle 33 through which the fixing plate 3 can be conveniently moved in the parallel sliding rails 42 and 42' of the guide plate 4 with the hand, a plurality of raised portions 34 and 34' at two opposite sides, which are retained in contact with inside surfaces of the sliding rails 42 and 42' to stabilize the movement of the fixing plate 3 in the sliding rails 42 and 42', two first elongated notches 36 and 36' longitudinally extended to one end thereof and arranged in parallel, a first springy suspending area 5 defined between the first elongated notches 36 and 36', a longitudinal sliding slot 35 at the first springy suspending area 5 which receives a guide block 43 at the guide plate 4, enabling the fixing plate 3 to be smoothly moved in the sliding rails 42 and 42', two second elongated notches 38 and 38' longitudinally extended to an opposite end thereof and arranged in parallel, a second springy suspending area 6 defined between the second elongated notches 38 and 38', and a transverse positioning portion 37 for engagement with a first locating portion 44 or a second locating portion 45 at the guide plate 4. The first springy area 5 is deformable, such that the guide block 43 of the guide plate 4 can conveniently be coupled to the longitudinal sliding slot 35. The second springy area 6 is deformable, such that the positioning portion 37 of the fixing plate 3 can be moved with the fixing plate 3 between the first position where the positioning portion 37 is forced into engagement with the first locating portion 44, and the second position where the positioning portion 37 is forced into engagement with the second locating portion 45.

Figure 5:
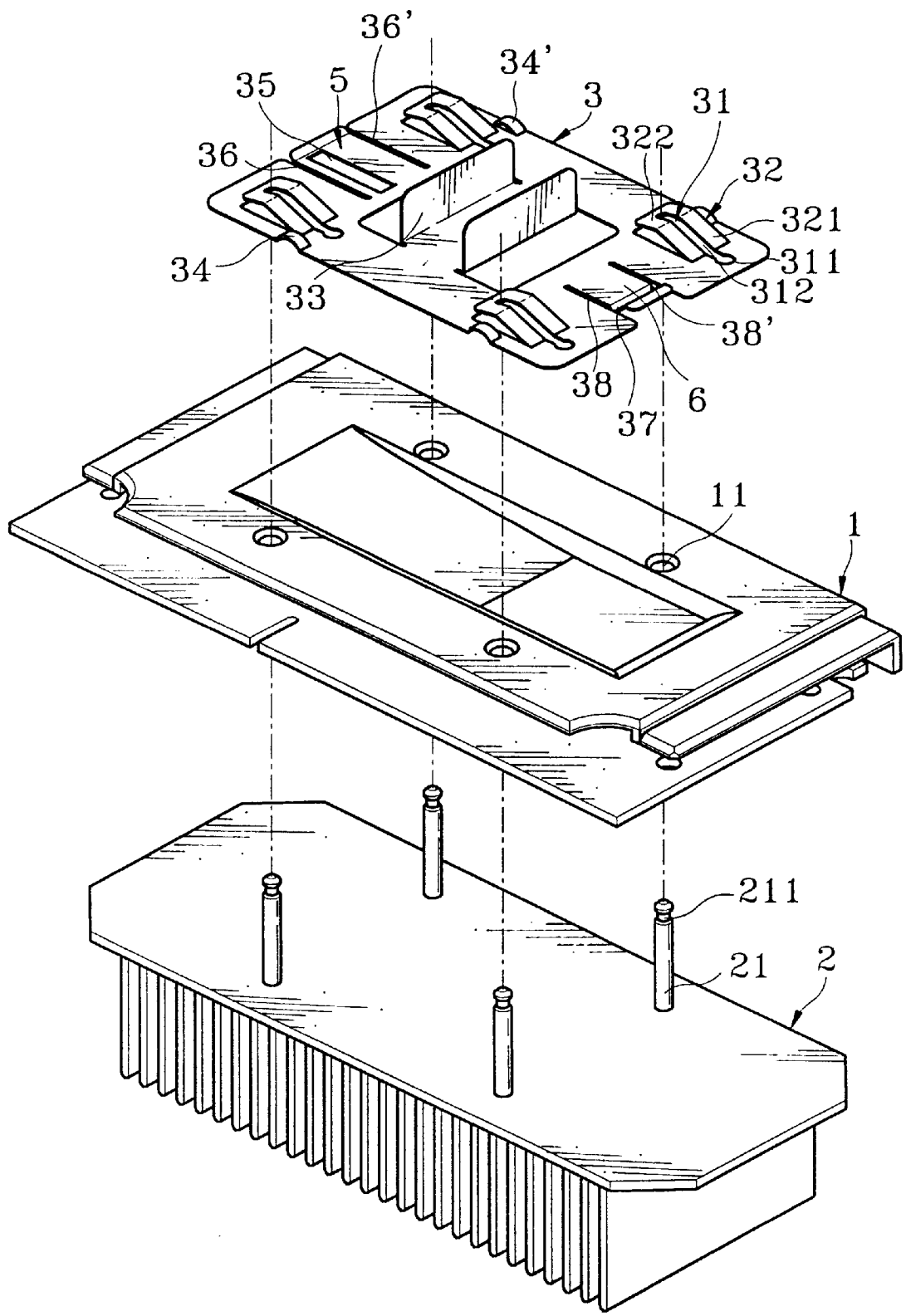
FIG. 5 is an exploded view of an alternate form of the present invention.

FIG. 5 shows an alternate form of the present invention. This alternate form eliminates the aforesaid guide plate 4. Of course, the height of the upright mounting rods 21 must be relatively shortened, so that the fixing plate 3 can firmly be secured to the upright mounting rods 21 of the heat sink 2 to hold down the CPU module 1 on the heat sink 2.

It is to be understood that the drawings are designed for purposes of illustration only, and are not intended as a definition of the limits and scope of the invention disclosed.

What is claimed is:

1. A cartridge type CPU module cooling structure comprising:

a CPU module having a plurality of through holes;

a heat sink attached to said CPU module at one side, said heat sink comprising a plurality of upright mounting rods respectively inserted through the through holes at said CPU module, said upright mounting rods each having a neck; and a fixing plate fastened to the upright mounting rods of said heat sink to hold down said CPU module on said heat sink, said fixing plate comprising a plurality of projecting spring leaves respectively coupled to the upright mounting rods of said heat sink, and a plurality of mounting slots respectively extended to said spring leaves for permitting said spring leaves to be coupled to the upright mounting rods of said heat sink, said mounting slots each comprising an expanded insertion portion at one end through which one upright mounting rod of said heat sink is inserted to hold said fixing plate on said CPU module at a first position, and an elongated guide portion extended from the respective expanded insertion portion to a part of one spring leaf into which the neck of one upright mounting rod of said heat sink is engaged to hold said fixing plate on said CPU module at a second position, causing the respective spring leaf to deform and to impart a pressure to said CPU module against said heat sink.

2. The cartridge type CPU module cooling structure of claim 1 wherein said fixing plate comprises handle means through which said fixing plate is moved with the hand relative to said heat sink.

3. The cartridge type CPU module cooling structure of claim 1 wherein said spring leaves each comprise a sloping portion integral with said fixing plate, and a retaining portion extended from said sloping portion.

4. A cartridge type CPU module cooling structure comprising:

a CPU module having a plurality of through holes;

a heat sink attached to said CPU module at one side, said heat sink comprising a plurality of upright mounting rods respectively inserted through the through holes at said CPU module, said upright mounting rods each having a neck;

a fixing plate fastened to the upright mounting rods of said heat sink to hold down said CPU module on said heat sink, said fixing plate comprising a plurality of projecting spring leaves respectively coupled to the upright mounting rods of said heat sink, and a plurality of mounting slots respectively extended to said spring leaves for permitting said spring leaves to be coupled to the upright mounting rods of said heat sink, said mounting slots each comprising an expanded insertion portion at one end through which one upright mounting rod of said heat sink is inserted to hold said fixing plate on said CPU module at a first position, and an elongated guide portion extended from the respective expanded insertion portion to a part of one spring leaf into which the neck of one upright mounting rod of said heat sink is engaged to hold said fixing plate on said CPU module at a second position, causing the respective spring leaf to deform and to impart a pressure to said CPU module against said heat sink; and a guide plate retained between said CPU module and said fixing plate, said guide plate comprising a plurality of through holes through which the upright mounting rods of said heat sink pass, and two parallel guide rails longitudinally disposed at two opposite lateral sides into which said fixing plate is inserted and moved between said first position and said second position.

5. The cartridge type CPU module cooling structure of claim 4 wherein said fixing plate comprises handle means through which said fixing plate is moved with the hand relative to said heat sink.

6. The cartridge type CPU module cooling structure of claim 4 wherein said spring leaves each comprise a sloping portion integral with said fixing plate, and a retaining portion extended from said sloping portion.

7. The cartridge type CPU module cooling structure of claim 4 wherein said fixing plate comprises a plurality of raised portions at two opposite sides respectively retained in contact with inside surfaces of said sliding rails to stabilize movement of said fixing plate in said sliding rails.

8. The cartridge type CPU module cooling structure of claim 4 wherein said fixing plate comprises a longitudinal sliding slot longitudinally extended to one end thereof, and said guide plate comprises a guide block at one end coupled to the longitudinal sliding slot of said fixing plate.

9. The cartridge type CPU module cooling structure of claim 8 wherein said fixing plate comprises two elongated notches longitudinally extended to one end thereof and arranged in parallel at two opposite sides of said sliding slot, said elongated notches defining a springy suspending area around said longitudinal sliding slot.

10. The cartridge type CPU module cooling structure of claim 4 wherein said fixing plate comprises a positioning portion; said guide plate comprises a first locating portion for engagement with said positioning portion of said fixing plate to hold said fixing plate at said first position, and a second locating portion for engagement with said positioning portion of said fixing plate to hold said fixing plate at said second position.

11. The cartridge type CPU module cooling structure of claim 10 wherein said fixing plate comprises two second elongated notches longitudinally extended to one end thereof and arranged in parallel at two opposite sides of said positioning portion and defining a springy area around said positioning portion.

* * * * *